(12) United States Patent
Bolognia et al.

(10) Patent No.: US 8,115,283 B1
(45) Date of Patent: Feb. 14, 2012

(54) REVERSIBLE TOP/BOTTOM MEMS PACKAGE

(75) Inventors: David Bolognia, Scottsdale, AZ (US); Bob Shih-Wei Kuo, Chandler, AZ (US); Bud Troche, Gilbert, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 199 days.

(21) Appl. No.: 12/502,627

(22) Filed: Jul. 14, 2009

(51) Int. Cl.
*H01L 23/552* (2006.01)
*H01L 23/02* (2006.01)
*H01L 23/48* (2006.01)
*H01L 23/52* (2006.01)
*H01L 29/40* (2006.01)

(52) U.S. Cl. ........ 257/660; 257/680; 257/678; 257/734; 257/659

(58) Field of Classification Search .................. 257/660, 257/692, 693, 678, 680, 684, 686, 690, 695, 257/698, 704, 710, 731–734, 433, 659
See application file for complete search history.

(56) References Cited

U.S. PATENT DOCUMENTS

| | | | |
|---|---|---|---|
| 6,686,649 B1 * | 2/2004 | Mathews et al. | 257/659 |
| 2005/0207605 A1 * | 9/2005 | Dehe et al. | 381/369 |
| 2008/0315385 A1 * | 12/2008 | Gerber et al. | 257/686 |

* cited by examiner

*Primary Examiner* — Chuong A. Luu
(74) *Attorney, Agent, or Firm* — Weiss & Moy, P.C.; Jeffrey D. Moy

(57) ABSTRACT

A semiconductor device has a base substrate having a plurality of metal traces and a plurality of base vias. An opening is formed through the base substrate. At least one die is attached to the first surface of the substrate and positioned over the opening. A cover substrate has a plurality of metal traces. A cavity in the cover substrate forms side wall sections around the cavity. The cover substrate is attached to the base substrate so the at least one die is positioned in the interior of the cavity. Ground planes in the base substrate are coupled to ground planes in the cover substrate to form an RF shield around the at least one die.

14 Claims, 9 Drawing Sheets

REVERSIBLE TOP/BOTTOM MEMS PACKAGE

FIELD OF THE INVENTION

This invention relates to a Micro-Electro-Mechanical Systems (MEMS) package, and, more specifically, to a system and method for providing a reversible top and bottom port MEMS package where the acoustic port can be either on the bottom or on the top substrate.

BACKGROUND OF THE INVENTION

Acoustic performance in a MEMS based device requires an acoustic chamber in the package and an open port to the chamber to receive sound wave input. MEMS devices exist where the port is either on the top or bottom of the package. The port generally points to the sound source in the Original Equipment Manufacturer (OEM) application. It is challenging and expensive to align and acoustically couple the MEMS device with the input hole in a top port application.

Bottom port MEMS devices normally have a hole in the MEMS package substrate, as well as a hole in the mother board to which the MEMS device is mounted. Top port MEMS devices have a hole in the lid (or shield) above the MEMS device. In a top port MEMS package, either the hole is not aligned with the MEMS device and the performance suffers or the MEMS device is coupled acoustically to the lid (or shield). This acoustic coupling is slow and expensive to make. Additionally, in a flip chip design, the MEMS electrical interconnect now point away from the port, making contact with the substrate. This results in a challenging process, due to the exposed MEMS structure, inability to under-fill, or use wet processes for bumping.

Therefore, a need existed to provide a system and method to overcome the above problem. The system and method will provide a reversible top and bottom port MEMS package where the port can be either on the bottom or on the top substrate.

SUMMARY OF THE INVENTION

A semiconductor device has a base substrate having a plurality of metal traces and a plurality of base vias. An opening is formed through the base substrate. At least one die is attached to the first surface of the substrate and positioned over the opening. A cover substrate has a plurality of metal traces. A cavity in the cover substrate forms side wall sections around the cavity. The cover substrate is attached to the base substrate so the at least one die is positioned in the interior of the cavity. Ground planes in the base substrate are coupled to ground planes in the cover substrate to form an RF shield around the at least one die.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

Figure 1:
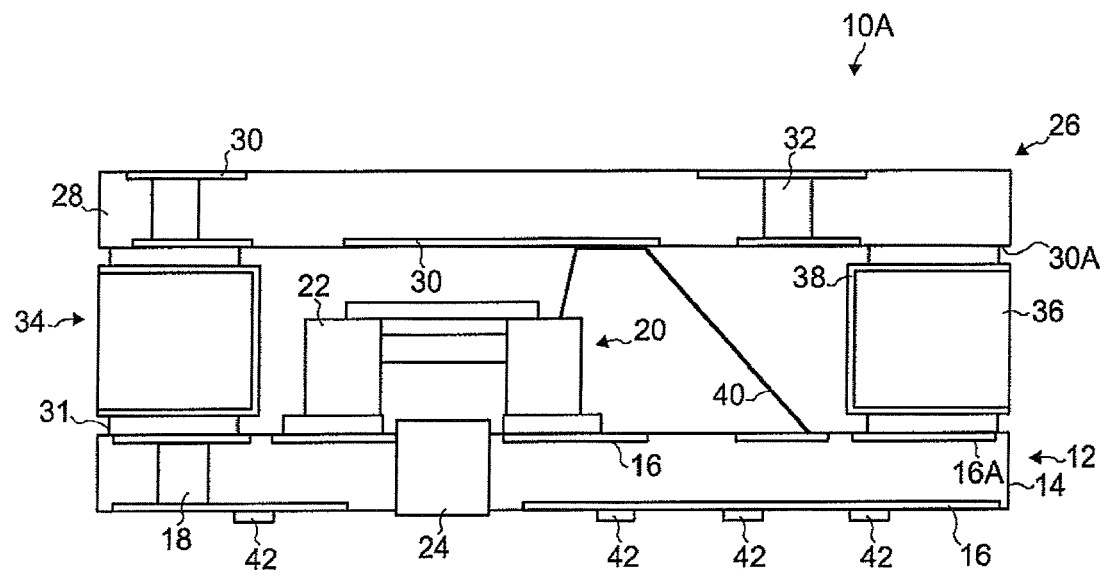
FIG. 1 is a cross-sectional side view of one embodiment of a MEMS package.

Referring to FIG. 1, a cross-sectional side view of a semiconductor device 10A (hereinafter device 10A) of the present invention is shown. The device 10A will have a base substrate 12 having an approximately planar first surface and an approximately planar second surface opposing the first surface. The base substrate 12 may be any one chosen from a conventional rigid PCB, a flexible PCB, a ceramic or an equivalent thereof, and the like, but the kind of base substrate 12 is not limited herein.

The base substrate 12 includes an insulation layer 14 having predetermined area and thickness. The insulation layer 14 has an approximately planar first surface and an approximately planar second surface opposing the first surface. The insulation layer 14 will have one or more metal traces 16 formed thereon. In the embodiment shown in FIG. 1, the insulation layer 14 has metal traces 16 formed on the first and second surface of the insulation layer 14. However, the number of metal traces 16 is not limited to the number shown in FIG. 1. In general, the insulation layer 14 will have multiple layers of metal traces 16 formed therein. When multiple layers of metal traces 16 are formed in the insulation layer 14, a dielectric layer is generally applied between the layers of metal traces 16. The dielectric layer is used as an insulating layer to separate the layers of metal traces 16. A soldermask may be placed over the top surface of the metal traces 16 to protect the metal traces 16. One or more vias 18 may be formed through the base substrate 12. The vias 18 are generally plated or filled with a conductive material.

The semiconductor device 10A has at least one electronic component 20. In the present embodiment, a single electronic component 20 is attached to the base substrate 12. The electronic component 20 can be a transducer, a microphone, a pressure sensor, and the like. In the present embodiment, the single electronic component 20 is a transducer 22. However, this should not be seen as to limit the scope of the present invention.

The transducer 22 is placed on the first surface of the base substrate 14 face down and positioned over an opening 24 formed through the base substrate 12. The opening 24 is an acoustic port that allows the transducer 22 to accurately receive sound waves and convert the sound waves to electrical signals and which provides a pressure reference for the transducer 22.

The transducer 22 is attached to the first surface of the base substrate 12. The transducer 22 may be attached to the base substrate 14 in a plurality of different manners. In the embodiment shown in FIG. 1, the transducer 22 is attached to the substrate 14 via a wire bonding process. However, the above is given only as an example. The transducer 22 may be attached through other technologies such as surface mount technology, through hole technology, flip chip technology, and the like.

The device 10A has a cover substrate 26 having an approximately planar first surface and an approximately planar second surface opposing the first surface. The cover substrate 26 may be any one chosen from a conventional rigid PCB, a flexible PCB, a ceramic or an equivalent thereof, and the like, but the kind of base substrate 12 is not limited herein.

The cover substrate 26 includes an insulation layer 28 having predetermined area and thickness. The insulation layer 28 has an approximately planar first surface and an approximately planar second surface opposing the first surface. The insulation layer 28 will have one or more metal traces 30 formed thereon. In the embodiment shown in FIG. 1, the insulation layer 28 has metal traces 30 formed on the first and second surface of the insulation layer 28. However, the number of metal traces 30 is not limited to the number shown in FIG. 1. In general, the insulation layer 28 will have multiple layers of metal traces 30 formed therein. When multiple layers of metal traces 30 are formed in the insulation layer 28, a dielectric layer is generally applied between the layers of metal traces 30. The dielectric layer is used as an insulating layer to separate the layers of metal traces 30. A soldermask may be placed over the top surface of the metal traces 30 to protect the metal traces 30. One or more vias 32 may be formed through the cover substrate 26. The vias 32 are generally plated or filled with a conductive material.

Side sections 34 are attached to the first surface of the base substrate 12 and to the second surface of the cover substrate 26. The side sections 34 are used to support the cover substrate 26 and in combination with the cover substrate 26 form an enclosed cavity housing the transducer 22. In accordance with the embodiment shown in FIG. 1, the side sections 34 are formed of a frame member 36. The frame member 36 is generally formed of a non-conductive material. A metal plating 38 may be applied on a plurality of exterior surfaces of the frame member 36. The metal plating 38 of the side sections 34 are attached to metal traces 16 and 30 on the base substrate 12 and cover substrate 26 respectively. In general, a conductive material 31 is used to attach the metal plating 38 to the metal traces 16 and 30. In general, a solder, a conductive paste, or the like is used to attach the metal plating 38 to the metal traces 16 and 30 on the base substrate 12 and cover substrate 26. In accordance with one embodiment, the metal traces 16 and 30 are ground planes 16A and 30A. Thus, the metal plating 38 forms a ground pathway from between the base substrate 12 and the cover substrate 26 creating a Faraday cage around the transducer 22 to blocks out external static electric fields. It should be noted that the ground planes 16A and 30A may be on the first and second surfaces of the base substrate 12 and the cover substrate 26. Alternatively the metal plating 38 of the side sections 34 may be attached to the ground planes 16A and 30A via one or more of the vias 18 and 32.

One or more wirebonds 40 are used to electrically attach the transducer 22 to the base substrate 12 and cover substrate 26. Each wirebond 40 will have a first end attached to the transducer 22. A second end of each wirebond 40 is attached to a metal trace 16 formed on the first surface of the base substrate 12. In general, the wirebonds 40 are attached to the transducer 22 and to the metal trace 16 via bond pads. The wirebonds 40 form a loop having a height which is greater than the height of the side sections 34.

When the cover substrate 26 is placed on the side sections 34, the top of the loops formed by the wirebonds 40 are compressed so that the top of the loops formed by the wirebonds 28 contact metal traces 30 on the second surface of the cover substrate 26. Thus, the active I/O run from the transducer 22 and/or the base substrate 12 to the cover substrate 26 through the high loop wirebonds 40, which compress and maintain contact with the metal traces 30 after assembly.

In the embodiment shown in FIG. 1, the device 10A is positioned as a bottom port device. The metal traces 16 formed on the second surface of the base substrate 12 will generally have bond pads 42 formed thereon. The bond pads 42 will allow the second surface of the base substrate 12 to be attached to an end user's board.

The device 10A may also be used as a top port device. In this case, the device 10A is turned over so that the opening 24 is facing upward. The vias 32 are used as interconnects for attaching the first surface of the cover substrate 26 to the end user's board. In accordance with one embodiment, the vias 32 are connected to pads (not shown) formed on the first surface of the cover substrate 26 and the pads are used as Land Grid Array (LGA) solder interconnects wherein a solder paste is applied directly between the pads and the end user's board.

Figure 2:
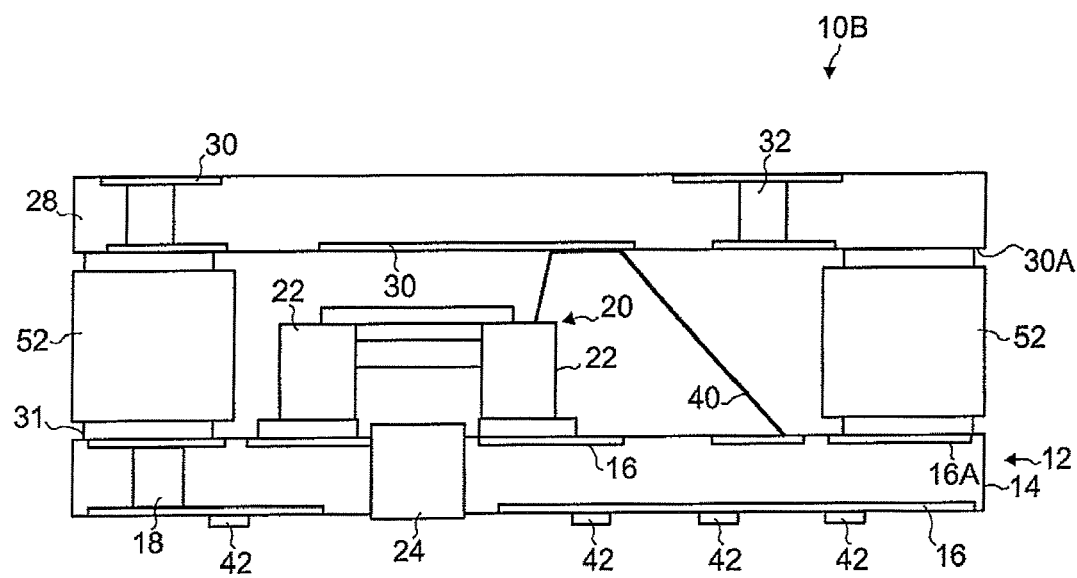
FIG. 2 is a cross-sectional side view of another embodiment of a MEMS package.

Referring to FIG. 2, another embodiment of the device 10B is shown. The device 10B is similar to that shown in FIG. 1. In this embodiment, the side sections 34 are formed of a conductive interposer 52. The conductive interposer 52 is generally a metal interposer. The conductive interposer 52 is attached to ground planes 16A and 30A on the base substrate 12 and cover substrate 26 respectively by the conductive material 31. In general, the conductive material is a solder, a conductive paste, or the like. In this embodiment, the conductive interposer 52 forms a ground pathway between the base substrate 12 and the cover substrate 26 creating a Faraday cage around the transducer 22 to blocks out external static electric fields. It should be noted that the ground planes 16A and 30A may be on the first and second surfaces of the base substrate 12 and the cover substrate 26. Alternatively the conductive interposer 52 may be attached to the ground planes 16A and 30A via one of the vias 18 and 32.

Figure 3:
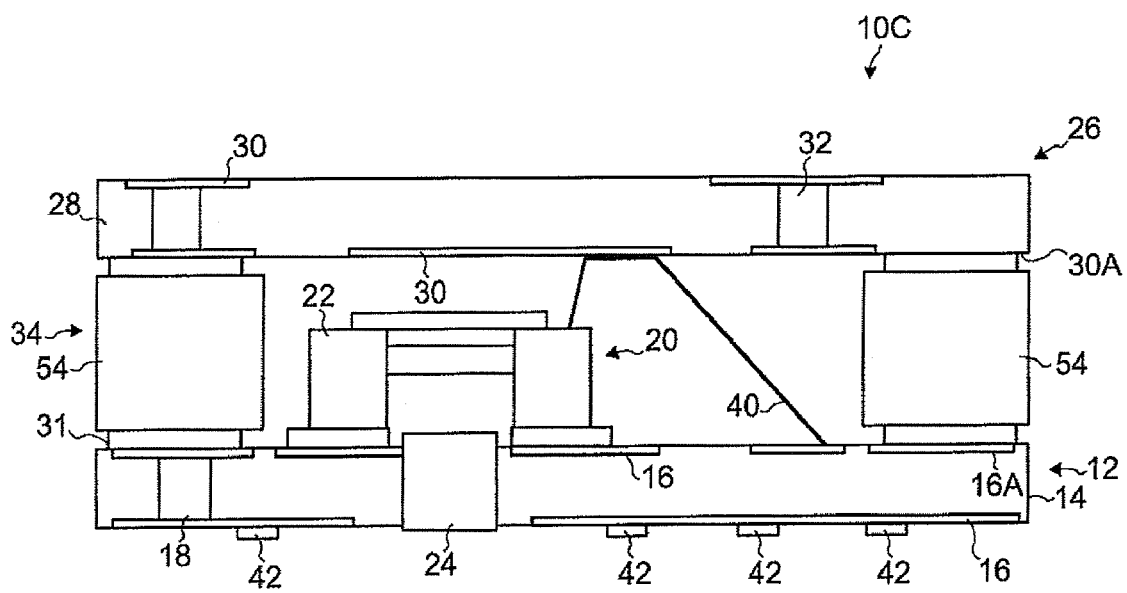
FIG. 3 is a cross-sectional side view of another embodiment of a MEMS package.

Referring to FIG. 3, another embodiment of the device 10C is shown. The device 10D is similar to that shown in FIG. 1. In this embodiment, the side sections 34 are formed of a conductive molding compound 54. The conductive molding compound 54 is generally a molding compound having a plurality of thermally conductive particles to form a thermally conductive path in the molding compound. The conductive molding compound 54 is attached to ground planes 16A and 30A on the base substrate 12 and cover substrate 26 respectively by the conductive material 31. In general, the conductive material is a solder, a conductive paste, or the like. In this embodiment, the conductive molding compound 54 forms a ground pathway between the base substrate 12 and the cover substrate 26 creating a Faraday cage around the transducer 22 to blocks out external static electric fields. It should be noted that the ground planes 16A and 30A may be on the first and second surfaces of the base substrate 12 and the cover substrate 26. Alternatively the conductive molding compound 54 may be attached to the ground planes 16A and 30A via one of the vias 18 and 32.

Figure 4:
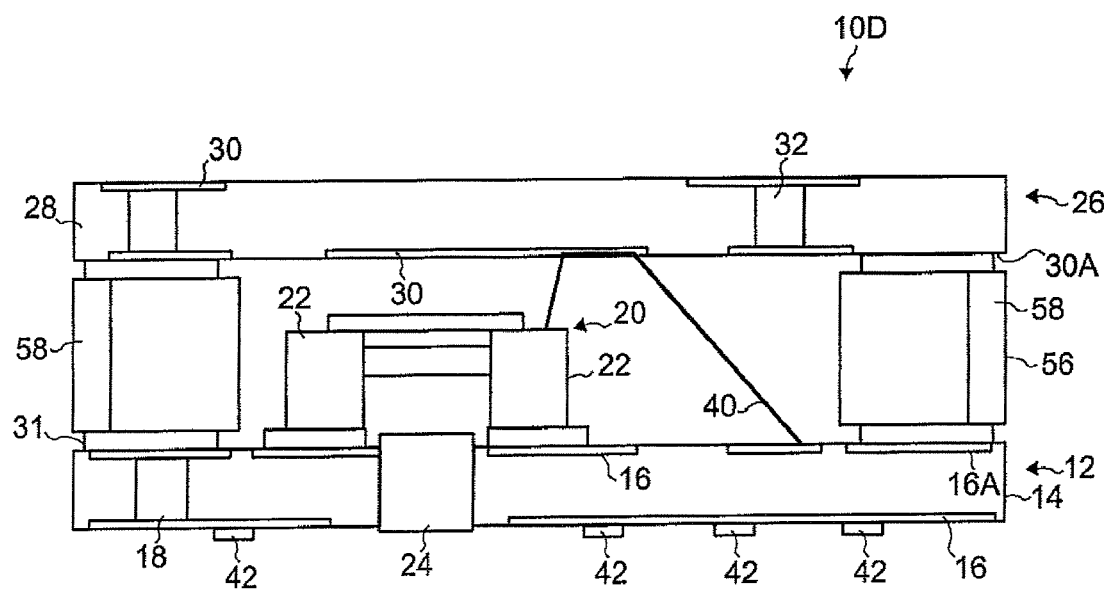
FIG. 4 is a cross-sectional side view of another embodiment of a MEMS package.

Referring to FIG. 4, another embodiment of the device 10D is shown. The device 10D is similar to that shown in FIG. 1. In this embodiment, the side sections 34 are formed of a frame member 36. The frame member 36 is generally formed of a non-conductive material. One or more vias 56 are formed in the frame member 36. The vias 56 are plated or filled with a conductive material 58. The vias 56 are generally exposed through a saw process during singulation of the device 10D. The frame members 36 and the vias 56 are attached to ground planes 16A and 30A on the base substrate 12 and cover substrate 26 respectively by the conductive material 31. In general, the conductive material is a solder, a conductive paste, or the like. In this embodiment, the vias 56 plated/filled with the conductive material 58 forms a ground pathway between the base substrate 12 and the cover substrate 26 creating a Faraday cage around the transducer 22 to blocks out external static electric fields. It should be noted that the ground planes 16A and 30A may be on the first and second surfaces of the base substrate 12 and the cover substrate 26. Alternatively the vias 56 plated/filled with the conductive material 56 may be attached to the ground planes 16A and 30A via one of the vias 18 and 32.

Figure 5:
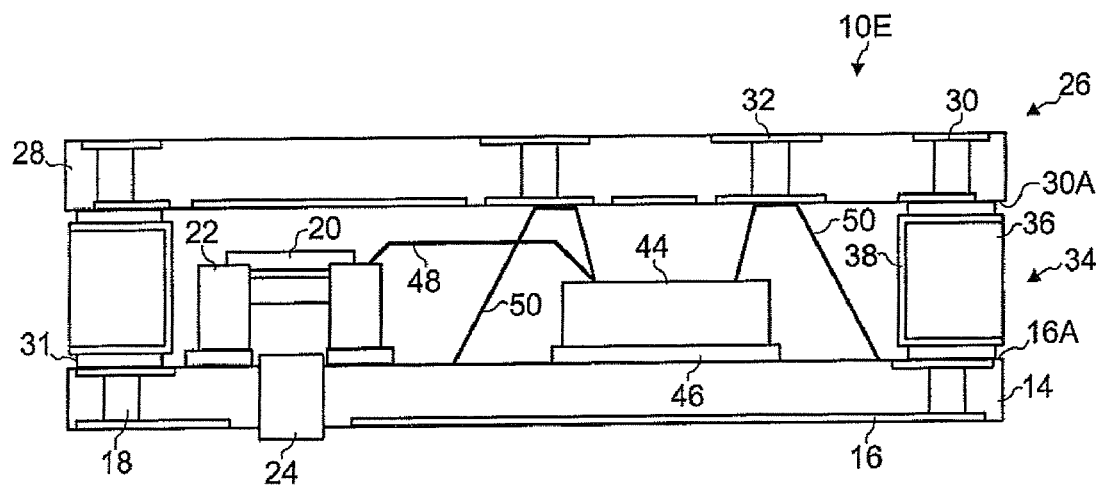
FIG. 5 is a cross-sectional side view of the MEMS package depicted in FIG. 1 having a multiple die design.

Referring to FIG. 5, another embodiment of the device 10E is shown. The device 10E is similar to that shown in FIG. 1. In this embodiment, the device 10E has two electronic components 20 attached to the first surface of the base substrate 12. One of the electronic components 20 is the transducer 22. The second electronic component 20 is an amplifier 44. The amplifier 44 is used to increase the strength of the signals received by the transducer 22.

The transducer 22 is placed on the base substrate 12 so to be positioned over the opening 24 formed through the base substrate 12. The amplifier 44 is positioned on the first surface of the base substrate 12 and next to the transducer 22. The transducer 22 and amplifier 44 are then electrically attached to metal traces 16 formed on the first surface of the base substrate 12 and to each other. Different methods may be used to attach and electrically couple the electronic devices to the substrate 14.

In the present embodiment, an adhesive 46 is used to attach the amplifier 44 to the base substrate 12. The adhesive may be a film, a paste or the like. The listing of the above is given as an example and should not be seen as to limit the scope of the present invention. Wirebonds 48 are then used to electrically connect the amplifier 44 to the transducer 22. The transducer 22 is attached to the base substrate 14 via a wire bonding process. However, the above is given only as an example. Other technology may be used to electrically couple the electronic devices without departing from the spirit and scope of the invention.

The amplifier 44 is electrically attached to the metal traces 16 and 30 formed on the base substrate 14 and cover substrate 26. One or more wirebonds 50 are used to electrically attach the amplifier 44 to the base substrate 14 and cover substrate 26. Each wirebond 50 will have a first end attached to the amplifier 44. A second end of each wirebond 50 is attached to a metal trace 16 formed on the first surface of the base substrate 12. In general, the wirebonds 50 are attached to the amplifier 44 and to the metal trace 16 via bond pads. The wirebonds 50 form a loop having a height which is greater than the height of the side sections 34.

When the cover substrate 26 is placed on the side sections 34, the top of the loops formed by the wirebonds 50 are compressed so that the top of the loops formed by the wirebonds 50 contact metal traces 30 on the cover substrate 26. Thus, the active I/O run from the amplifier 44 and/or the base substrate 12 to the cover substrate 26 through the high loop wirebonds 50, which compress and maintain contact with the metal traces 30 after assembly.

The metal plating 38 of the side sections 34 are attached to ground planes 16A and 30A on the base substrate 12 and cover substrate 26 respectively. In general, a conductive material 31 is used to attach the metal plating 38 to the ground planes 16A and 30A. Thus, the metal plating 38 forms a ground pathway from between the base substrate 12 and the cover substrate 26 creating a Faraday cage around the transducer 22 and amplifier 44 to block out external static electric fields. It should be noted that the ground planes 16A and 30A may be on the first and second surfaces of the base substrate 12 and the cover substrate 26 respectively. Alternatively the metal plating 38 of the side sections 34 may be attached to the ground planes 16A and 30A via one of the vias 18 and 32.

In the embodiment shown in FIG. 5, the device 10E is positioned as a bottom port device. The metal traces 16 formed on the second surface of the base substrate 12 will generally have bond pads 42 formed thereon. The bond pads 42 will allow the second surface of the base substrate 12 to be attached to an end user's board.

The device 10E may also be used as a top port device. In this case, the device 10B is turned over so that the opening 24 is facing upward. The vias 32 are used as interconnects for attaching the first surface of the cover substrate 26 to the end user's board. In accordance with one embodiment, the vias 32 are connected to pads (not shown) formed on the first surface of the cover substrate 26 and the pads are used as Land Grid Array (LGA) solder interconnects wherein a solder paste is applied directly between the pads and the end user's board.

Figure 6:
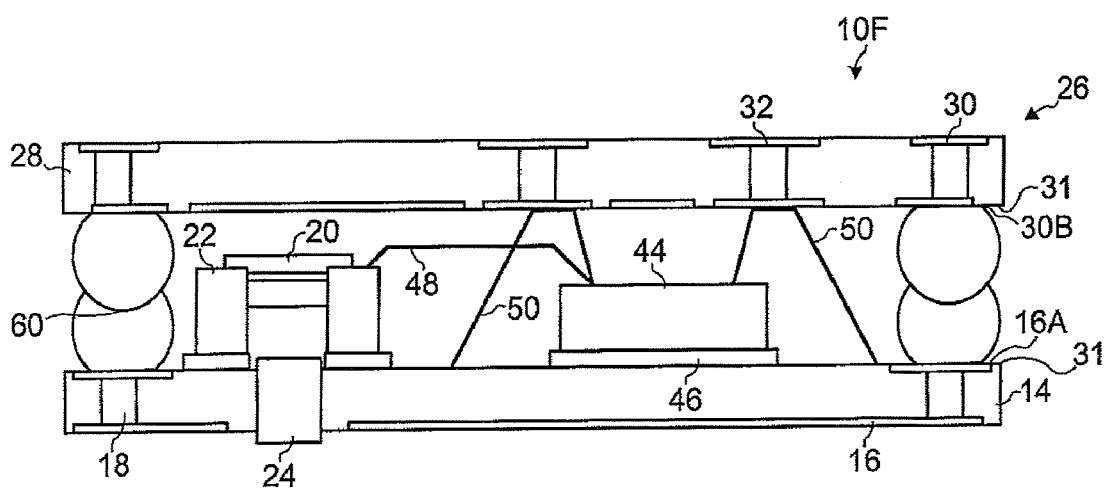
FIG. 6 is a cross-sectional side view of another embodiment of a MEMS package having a multiple die design.

Referring to FIG. 6, another embodiment of the device 10F is shown. The device 10F is similar to that shown in FIG. 5. In this embodiment, the side sections 34 are formed of a stacked solder ball structure 60. The stacked solder ball structure 60 is generally is attached to ground planes 16A and 30A on the base substrate 12 and cover substrate 26 respectively by the conductive material 31. In this embodiment, the stacked solder ball structure 60 forms a ground pathway between the base substrate 12 and the cover substrate 26 creating a Faraday cage around the transducer 22 and amplifier 44 to block out external static electric fields. It should be noted that the ground planes 16A and 30A may be on the first and second surfaces of the base substrate 12 and the cover substrate 26. Alternatively the stacked solder ball structure 60 may be attached to the ground planes 16A and 30A via one of the vias 18 and 32.

Figure 7A:
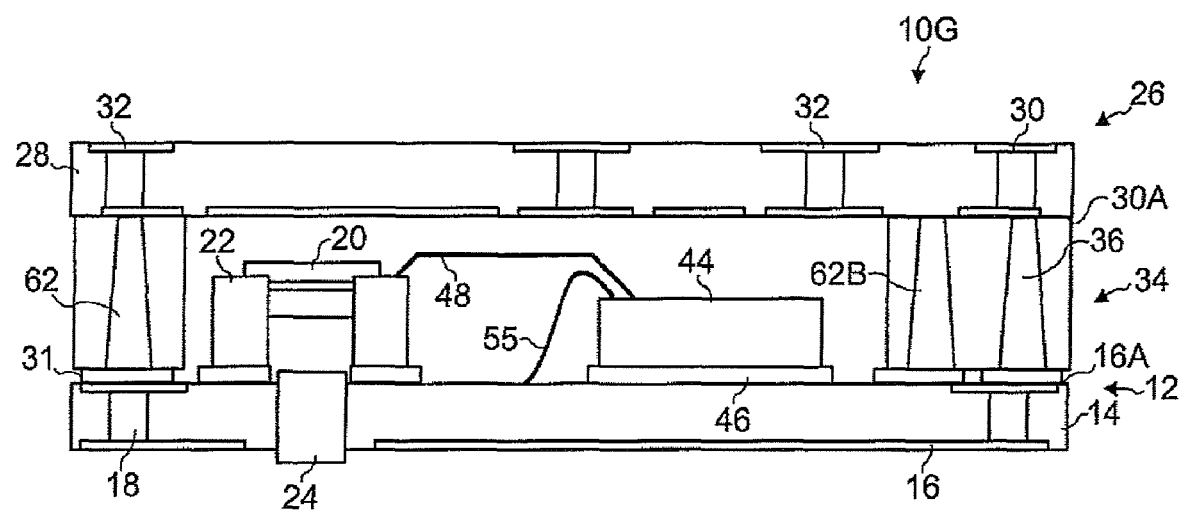
FIG. 7A is a cross-sectional side view of another embodiment of a MEMS package having a multiple die design.
Figure 7B:
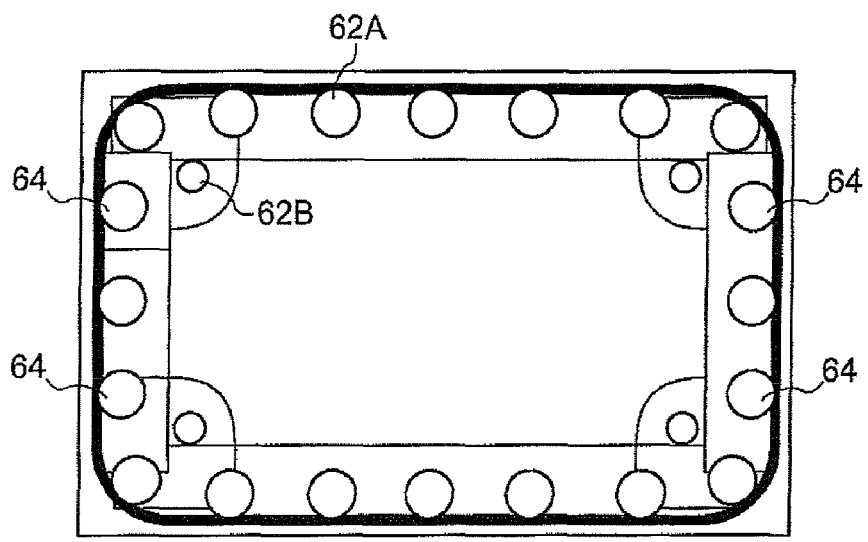
FIG. 7B is a bottom view of the cover substrate of the MEMS package of FIG. 7A.

Referring to FIGS. 7A and 7B, another embodiment of the device 10G is shown. The device 10G is similar to that shown in FIG. 5. The transducer 22 is placed on the base substrate 12 so to be positioned over the opening 24 formed through the base substrate 12. The amplifier 44 is positioned on the first surface of the base substrate 12 and next to the transducer 22. The transducer 22 and amplifier 44 are then electrically attached to metal traces 16 formed on the first surface of the base substrate 12 and to each other. Different methods may be used to attach and electrically couple the electronic devices to the substrate 14.

In the present embodiment, an adhesive 46 is used to attach the amplifier 44 to the base substrate 12. The adhesive may be a film, a paste or the like. The listing of the above is given as an example and should not be seen as to limit the scope of the present invention. Wirebonds 48 are then used to electrically connect the amplifier 44 to the transducer 22. The transducer 22 is attached to the base substrate 14 via a wire bonding process. However, the above is given only as an example. Other technology may be used to electrically couple the electronic devices without departing from the spirit and scope of the invention.

The amplifier 44 is electrically attached to the metal traces 16 formed on the base substrate 14. One or more wirebonds 55 are used to electrically attach the amplifier 44 to the base substrate 14. Each wirebond 55 will have a first end attached to the amplifier 44. A second end of each wirebond 55 is attached to a metal trace 16 formed on the first surface of the base substrate 12. In general, the wirebonds 55 are attached to the amplifier 44 and to the metal trace 16 via bond pads.

In this embodiment, the side sections 34 are formed of a frame member 36. The frame member 34 is generally formed of a non-conductive material. One or more vias 62 are formed in the frame member 34. The vias 62 are generally not exposed. The vias 62 are plated or filled with a conductive material 64. The vias 62A around the perimeter of the device 10G are generally used as grounding vias. The vias 62A are attached to ground planes 16A and 30A on the base substrate 12 and cover substrate 26 respectively by the conductive material 31. In general, the conductive material is a solder, a conductive paste, or the like. In this embodiment, the vias 62A plated/filled with the conductive material 64 forms a ground pathway between the base substrate 12 and the cover substrate 26 creating a Faraday cage around the transducer 22 and amplifier 44 to blocks out external static electric fields. It should be noted that the ground planes 16A and 30A may be on the first and second surfaces of the base substrate 12 and the cover substrate 26. Alternatively the vias 62A may be attached to the ground planes 16A and 30A via one of the vias 18 and 32. As shown more clearly in FIG. 7B, the ground plane 30A forms a ground ring 31 around the perimeter of the cover substrate 26.

The device 10G further has vias 62B. In the embodiment shown, the vias 62B are located inside of the perimeter formed by the vias 62A. The vias 62B are generally used as signal vias. The vias 62B are attached to metal traces 16 and 30 on the base substrate 12 and cover substrate 26 respectively by the conductive material 31. In general, the conductive material is a solder, a conductive paste, or the like. In this embodiment, the vias 62B plated/filled with the conductive material 64 forms an I/O run between the base substrate 12 and cover substrate 26.

Figure 8A:
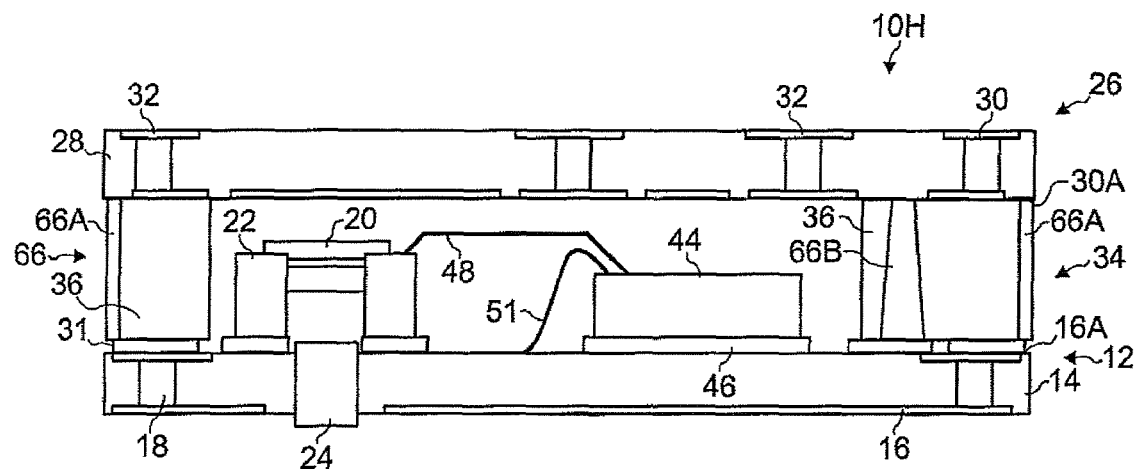
FIG. 8A is a cross-sectional side view of another embodiment of a MEMS package having a multiple die design.
Figure 8B:
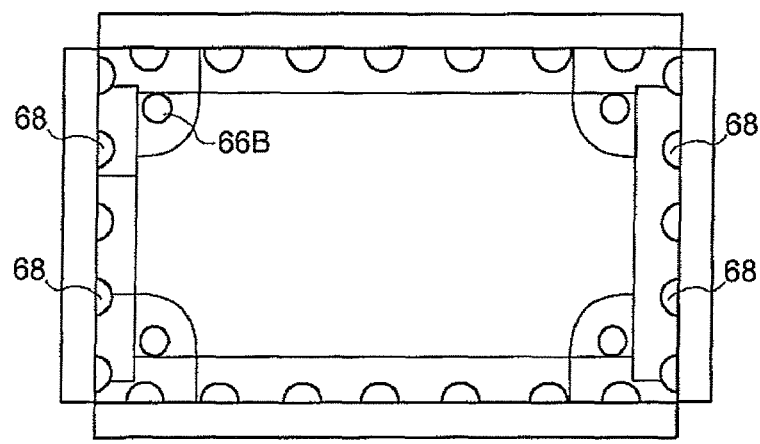
FIG. 8B is a bottom view of the cover substrate of the MEMS package of FIG. 8A.

Referring to FIGS. 8A and 8B, another embodiment of the device 10H is shown. The device 10G is similar to that shown in FIG. 5. In this embodiment, the side sections 34 are formed of a frame member 36. The frame member 34 is generally formed of a non-conductive material. One or more vias 66 are formed in the frame member 66. The vias 66 are plated or filled with a conductive material 68. The vias 66A around the perimeter of the device 10H are exposed. The vias 66A are exposed through a saw process during singulation of the device 10H. The vias 66A are generally used as grounding vias. The vias 66A are attached to ground planes 16A and 30A on the base substrate 12 and cover substrate 26 respectively by the conductive material 31. In general, the conductive material is a solder, a conductive paste, or the like. In this embodiment, the vias 66A plated/filled with the conductive material 68 forms a ground pathway between the base substrate 12 and the cover substrate 26 creating a Faraday cage around the transducer 22 to blocks out external static electric fields. It should be noted that the ground planes 16A and 30A may be on the first and second surfaces of the base substrate 12 and the cover substrate 26. Alternatively the vias 66A may be attached to the ground planes 16A and 30A via one of the vias 18 and 32. As shown more clearly in FIG. 8B, the ground plane 30A forms a ground ring around the perimeter of the cover substrate 26.

The device 10H further has vias 66B. The vias 66B are generally used as signal vias. In the embodiment shown in FIGS. 8A and 8B, the vias 66B are formed inside of the vias 66A and are not exposed. The vias 66B are attached to metal traces 16 and 30 on the base substrate 12 and cover substrate 26 respectively by the conductive material 31. In general, the conductive material is a solder, a conductive paste, or the like. In this embodiment, the vias 66B plated/filled with the conductive material 68 form I/O signal pathways between the base substrate 12 and the cover substrate 26.

Figure 9A:
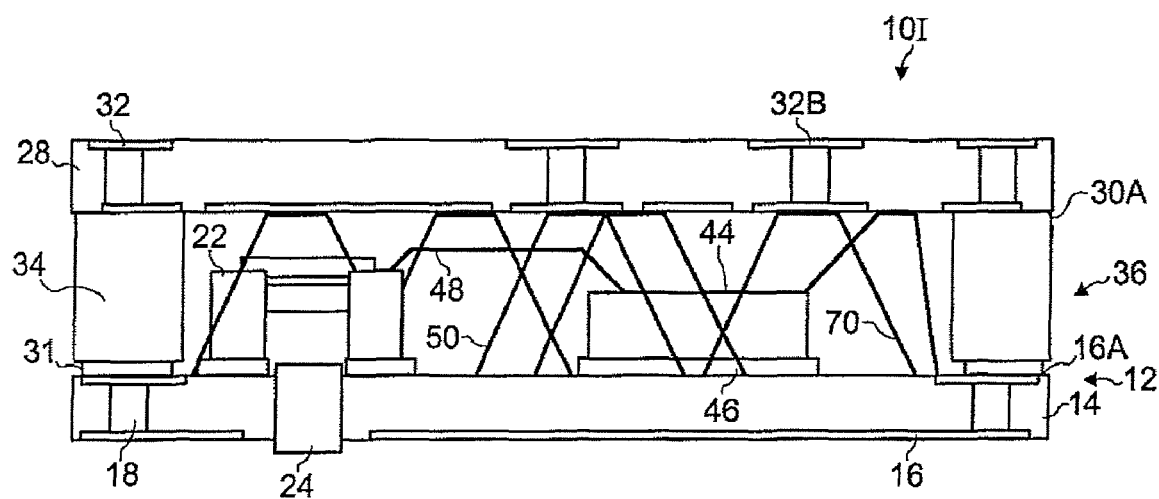
FIG. 9A is a cross-sectional side view of another embodiment of a MEMS package having a multiple die design.
Figure 9B:
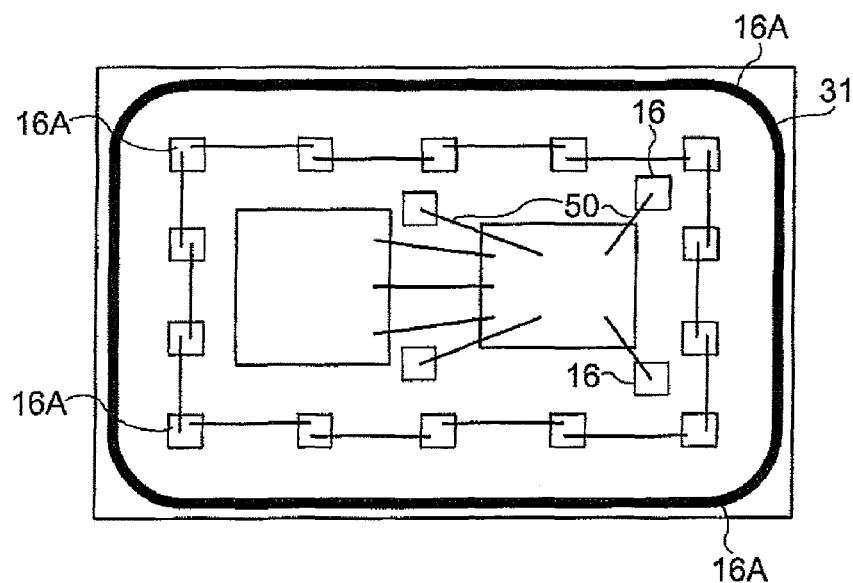
FIG. 9B is a transparent top view of the MEMS package of FIG. 9A.

Referring to FIGS. 9A and 9B, another embodiment of the device 10I is shown. In this embodiment, the device 10I has two electronic components 20 attached to the first surface of the base substrate 12. One of the electronic components 20 is the transducer 22. The second electronic component 20 is an amplifier 44. The amplifier 44 is used to increase the strength of the signals received by the transducer 22.

The transducer 22 is placed on the base substrate 12 so to be positioned over the opening 24 formed through the base substrate 12. The amplifier 44 is positioned on the first surface of the base substrate 12 and next to the transducer 22. The transducer 22 and amplifier 44 are then electrically attached to metal traces 16 formed on the first surface of the base substrate 12 and to each other. Different methods may be used to attach and electrically couple the electronic devices to the substrate 14.

In the present embodiment, an adhesive 46 is used to attach the amplifier 44 to the base substrate 12. The adhesive may be a film, a paste or the like. The listing of the above is given as an example and should not be seen as to limit the scope of the present invention. Wirebonds 48 are then used to electrically connect the amplifier 44 to the transducer 22. The transducer 22 is attached to the base substrate 14 via a wire bonding process. However, the above is given only as an example. Other technology may be used to electrically couple the electronic devices without departing from the spirit and scope of the invention.

The amplifier 44 is electrically attached to the metal traces 16 and 30 formed on the base substrate 14 and cover substrate 26. One or more wirebonds 50 are used to electrically attach the amplifier 44 to the base substrate 14 and cover substrate 26. Each wirebond 50 will have a first end attached to the amplifier 44. A second end of each wirebond 50 is attached to a metal trace 16 formed on the first surface of the base substrate 12. In general, the wirebonds 50 are attached to the amplifier 44 and to the metal trace 16 via bond pads. The wirebonds 50 form a loop having a height which is greater than the height of the side sections 34.

A plurality of wirebonds 70 is used to form an RF shield around the transducer 22 and amplifier 44. Each wirebond 70 will have a first end attached to a ground plane 16A on the first surface of the base substrate. A second end of each wirebond 70 is attached to a ground plane 16A on the first surface of the base substrate 12. The wirebonds 70 form a loop having a height which is greater than the height of the side sections 34.

When the cover substrate 26 is placed on the side sections 34, the top of the loops formed by the wirebonds 50 and 70 are compressed so that the top of the loops formed by the wirebonds 50 and 70 contact metal traces 30 and ground planes 30A respectively on the cover substrate 26. Thus, the wirebonds 50 and 70 form I/O signal pathways and ground pathways respectively between the base substrate 12 and the cover substrate 26. The wirebonds 70 create a Faraday cage around the transducer 22 and amplifier 44 to block out external static electric fields.

As shown more clearly in FIG. 9B, the cover substrate 26 has a plurality of vias 32. The vias 32 are generally plated or filled with a conductive material. The vias 32A around the perimeter of the cover substrate 26 are grounded forming a ground ring around the perimeter of the cover substrate 26. The vias 32B formed within the perimeter formed by the vias 32A are used as interconnects for attaching the first surface of the cover substrate 26 to the end user's board.

In this embodiment, the side sections 34 are formed of a frame member 36. The frame member 34 is generally formed of a non-conductive material. The frame member 34 may be attached to the base substrate 12 and the cover substrate 26 by an adhesive (not shown) or the like.

In the embodiment shown in FIGS. 9A and 9B, the device 10I is positioned as a bottom port device. The metal traces 16 formed on the second surface of the base substrate 12 will generally have bond pads 42 formed thereon. The bond pads 42 will allow the second surface of the base substrate 12 to be attached to an end user's board.

The device 10I may also be used as a top port device. In this case, the device 10I is turned over so that the opening 24 is facing upward. The vias 32B are used as interconnects for attaching the first surface of the cover substrate 26 to the end user's board. In accordance with one embodiment, the vias 32B connected to pads (not shown) formed on the first surface of the cover substrate 26 and the pads are used as Land Grid Array (LGA) solder interconnects wherein a solder paste is applied directly between the pads and the end user's board.

Figure 10A:
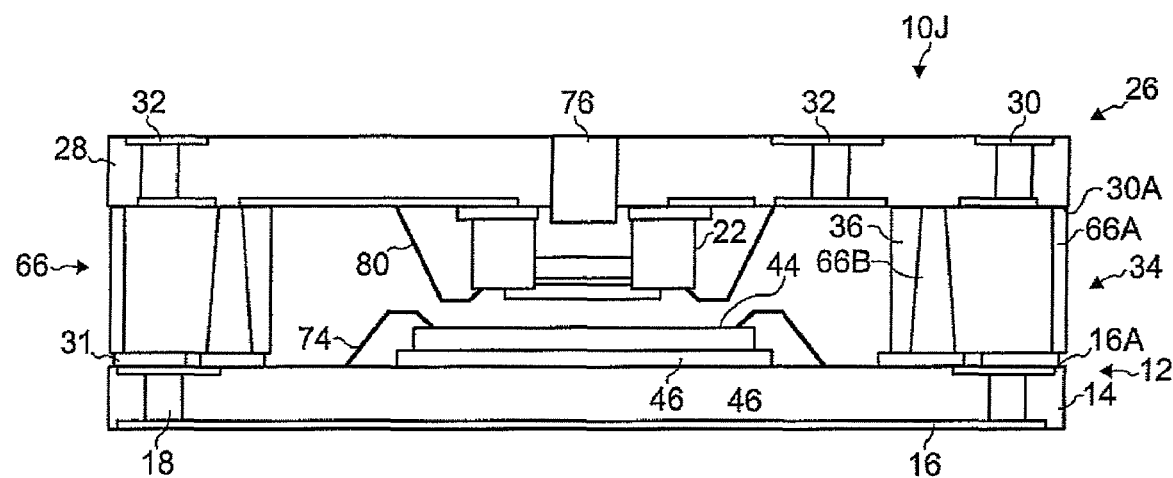
FIG. 10A is a cross-sectional side view of another embodiment of a MEMS package having a multiple die design.
Figure 10B:
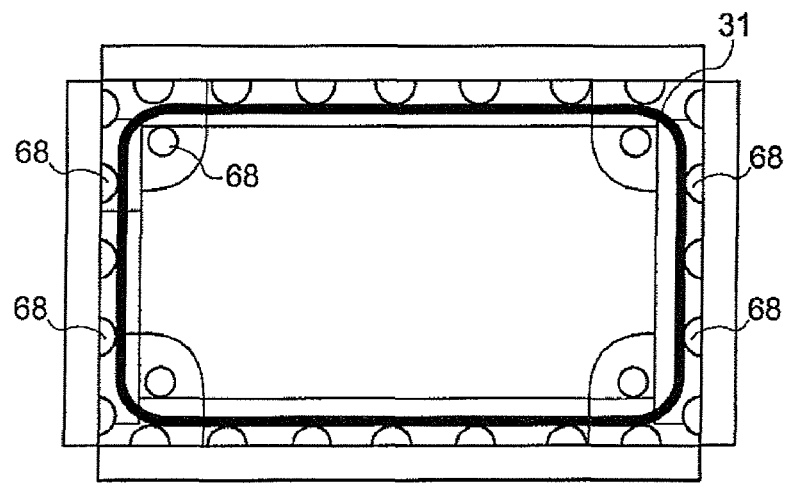
FIG. 10B is a bottom view of the cover substrate of the MEMS package of FIG. 9A.

Referring to FIGS. 10A and 10B, another embodiment of the device 10J is shown. The device 10J will have a base substrate 12 having an approximately planar first surface and an approximately planar second surface opposing the first surface. The base substrate 12 includes an insulation layer 14 having predetermined area and thickness. The insulation layer 14 has an approximately planar first surface and an approximately planar second surface opposing the first surface. The insulation layer 14 will have one or more metal traces 16 formed thereon. In the embodiment shown in FIG. 10A, the insulation layer 14 has metal traces 16 formed on the first and second surface of the insulation layer 14. However, the number of metal traces 16 is not limited to the number shown in FIG. 1. In general, the insulation layer 14 will have multiple layers of metal traces 16 formed therein. When multiple layers of metal traces 16 are formed in the insulation layer 14, a dielectric layer is generally applied between the layers of metal traces 16. The dielectric layer is used as an insulating layer to separate the layers of metal traces 16. A soldermask may be placed over the top surface of the metal traces 16 to protect the metal traces 16. One or more vias 18 may be formed through the base substrate 12. The vias 18 are generally plated or filled with a conductive material. In the embodiment shown in FIG. 10A, the base substrate 12 does not have the opening 24.

The semiconductor device 10J has the amplifier 44 positioned on the first surface of the base substrate 12. In the present embodiment, an adhesive 46 is used to attach the amplifier 44 to the base substrate 12. The adhesive may be a film, a paste or the like. The listing of the above is given as an example and should not be seen as to limit the scope of the present invention. Wirebonds 74 are then used to electrically connect the amplifier 44 to metal traces 16 formed on the first surface of the base substrate 12. Different methods may be used to electrically attach the amplifier 44 to the metal traces 16 without departing from the spirit and scope of the present invention.

The device 10J has a cover substrate 26 having an approximately planar first surface and an approximately planar second surface opposing the first surface. The cover substrate 26 includes an insulation layer 28 having predetermined area and thickness. The insulation layer 28 has an approximately planar first surface and an approximately planar second surface opposing the first surface. The insulation layer 28 will have one or more metal traces 30 formed thereon. In the embodiment shown in FIG. 10A, the insulation layer 28 has metal traces 30 formed on the first and second surface of the insulation layer 28. However, the number of metal traces 30 is not limited to the number shown in FIG. 10A. In general, the insulation layer 28 will have multiple layers of metal traces 30 formed therein. When multiple layers of metal traces 30 are formed in the insulation layer 28, a dielectric layer is generally applied between the layers of metal traces 30. The dielectric layer is used as an insulating layer to separate the layers of metal traces 30. A soldermask may be placed over the top surface of the metal traces 30 to protect the metal traces 30. One or more vias 32 may be formed through the cover substrate 26. The vias 32 are generally plated or filled with a conductive material. An opening 76 is formed through the base substrate 12.

The transducer 22 is placed on a first surface of the cover substrate 26. The transducer 22 is placed on the first surface of the cover substrate 14 face down and positioned over the opening 76 formed through the cover substrate 26. The opening 76 is an acoustic port that allows the transducer 22 to accurately receive sound waves and convert the sound waves to electrical signals and which provides a pressure reference for the transducer 22.

The transducer 22 is attached to the first surface of the cover substrate 26. The transducer 22 is attached to the substrate 14 via a wire bonding process. However, the above is given only as an example. The transducer 22 may be attached through other technologies such as surface mount technology, through hole technology, flip chip technology, and the like.

Wirebonds 80 are then used to electrically attach the transducer to metal traces 30 on the first surface of the cover substrate 26. Each wirebond 80 will have a first end attached to the transducer 22. A second end of each wirebond 80 is attached to a metal trace 30 on the first surface of the cover substrate 26.

Side sections 34 are attached to the first surface of the base substrate 12 and to the second surface of the cover substrate 26. The side sections 34 are used to support the cover substrate 26 and in combination with the cover substrate 26 form an enclosed cavity housing the device 10J. In the present embodiment, the side sections 34 are formed of a frame member 36. The frame member 34 is generally formed of a non-conductive material. One or more vias 66 are formed in the frame member 66. The vias 66 are plated or filled with a conductive material 68. The vias 66A around the perimeter of the device 10J are exposed. The vias 66A are exposed through a saw process during singulation of the device 10H. The vias 66A are generally used as grounding vias. The vias 66A are attached to ground planes 16A and 30A on the base substrate 12 and cover substrate 26 respectively by the conductive material 31. In general, the conductive material is a solder, a conductive paste, or the like. In this embodiment, the vias 66A plated/filled with the conductive material 68 forms a ground pathway between the base substrate 12 and the cover substrate 26 creating a Faraday cage around the transducer 22 to blocks out external static electric fields. It should be noted that the ground planes 16A and 30A may be on the first and second surfaces of the base substrate 12 and the cover substrate 26. Alternatively the vias 66A may be attached to the ground planes 16A and 30A via one of the vias 18 and 32. As shown more clearly in FIG. 8B, the ground plane 30A forms a ground ring around the perimeter of the cover substrate 26.

The device 10J further has vias 66B. The vias 66B are generally used as signal vias. In the embodiment shown in FIGS. 10A and 10B, the vias 66B are formed inside of the vias 66A and are not exposed. The vias 66B are attached to metal traces 16 and 30 on the base substrate 12 and cover substrate 26 respectively by the conductive material 31. In general, the conductive material is a solder, a conductive paste, or the like. In this embodiment, the vias 66B plated/filled with the conductive material 68 form I/O signal pathways between the base substrate 12 and the cover substrate 26.

In the embodiment shown in FIGS. 10A and 10B, the device 10J is positioned as a top port device. The metal traces 16 formed on the second surface of the base substrate 12 will generally have bond pads 42 formed thereon. The bond pads 42 will allow the second surface of the base substrate 12 to be attached to an end user's board.

The device 10J may also be used as a bottom port device. In this case, the device 10J is turned over so that the opening 76 is facing downward. The vias 32 are used as interconnects for attaching the first surface of the cover substrate 26 to the end user's board. In accordance with one embodiment, the vias 32 are connected to pads (not shown) formed on the first surface of the cover substrate 26 and the pads are used as Land Grid Array (LGA) solder interconnects wherein a solder paste is applied directly between the pads and the end user's board.

Figure 11:
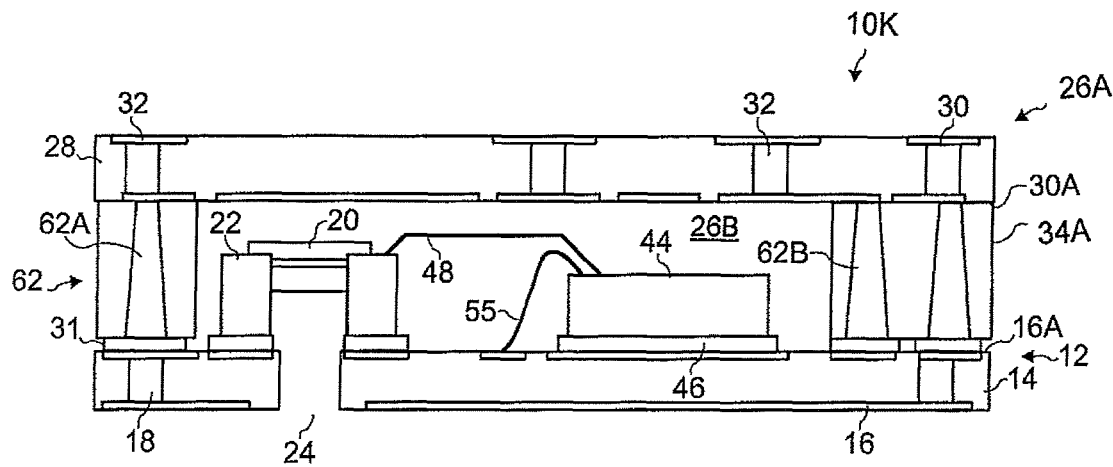
FIG. 11 is a cross-sectional side view of another embodiment of a MEMS package having a multiple die design.

Referring to FIG. 11, another embodiment of the device 10K is shown. The device 10K is similar to that shown in FIG. 7. The transducer 22 is placed on the base substrate 12 so to be positioned over the opening 24 formed through the base substrate 12. The amplifier 44 is positioned on the first surface of the base substrate 12 and next to the transducer 22. The transducer 22 and amplifier 44 are then electrically attached to metal traces 16 formed on the first surface of the base substrate 12 and to each other. Different methods may be used to attach and electrically couple the electronic devices to the substrate 14.

In the present embodiment, an adhesive 46 is used to attach the amplifier 44 to the base substrate 12. The adhesive may be a film, a paste or the like. The listing of the above is given as an example and should not be seen as to limit the scope of the present invention. Wirebonds 48 are then used to electrically connect the amplifier 44 to the transducer 22. The transducer 22 is attached to the base substrate 14 via a wire bonding process. However, the above is given only as an example. Other technology may be used to electrically couple the electronic devices without departing from the spirit and scope of the invention.

The amplifier 44 is electrically attached to the metal traces 16 formed on the base substrate 14. One or more wirebonds 55 are used to electrically attach the amplifier 44 to the base substrate 14. Each wirebond 55 will have a first end attached to the amplifier 44. A second end of each wirebond 55 is attached to a metal trace 16 formed on the first surface of the base substrate 12. In general, the wirebonds 55 are attached to the amplifier 44 and to the metal trace 16 via bond pads.

In this embodiment, the cover substrate 26A has a cavity 26B formed therein. The cavity 26B forms side wall sections 34A. The cover substrate 26A is positioned over and attached to the base substrate 12 so that the transducer 22 and amplifier 44 are positioned in the interior of the cavity 26B. The side wall sections 34A are attached to the first surface of the base substrate 12. In general, an adhesive is used to attach the side wall sections 34A to the base substrate 12. In accordance with one embodiment, the side wall sections 34A are attached to metal traces 16A on the first surface of the base substrate 12. A conductive material 31 is used to attach the side wall sections 34A to the metal traces 16.

One or more vias 62 are formed in the side wall sections 34A of the cover substrate 26A. The vias 62 are generally not exposed. The vias 62 are plated or filled with a conductive material 64. The vias 62A around the perimeter of the device 10K are generally used as grounding vias. The vias 62A are attached to ground planes 16A on the base substrate 12 by the conductive material 31. In general, the conductive material 31 is a solder, a conductive paste, or the like. The vias 62A are further coupled to ground planes 30A formed in the cover substrate 26A. In this embodiment, the vias 62A plated/filled with the conductive material 64 forms a ground pathway between the base substrate 12 and the cover substrate 26A creating a Faraday cage around the transducer 22 and amplifier 44 to blocks out external static electric fields. The ground plane 30A forms a ground ring 31 around the perimeter of the cover substrate 26A.

The device 10K may further have vias 62B. In the embodiment shown, the vias 62B are located inside of the perimeter formed by the vias 62A. The vias 62B are generally used as signal vias. The vias 62B are attached to metal traces 16 and 30 on the base substrate 12 and cover substrate 26A. The vias 62B are attached to metal traces 16 on the base substrate 12 by the conductive material 31. The vias 62A are further coupled to metal traces 30 formed in the cover substrate 26A. In this embodiment, the vias 62B plated/filled with the conductive material 64 forms an I/O run between the base substrate 12 and cover substrate 26A.

Figure 12:
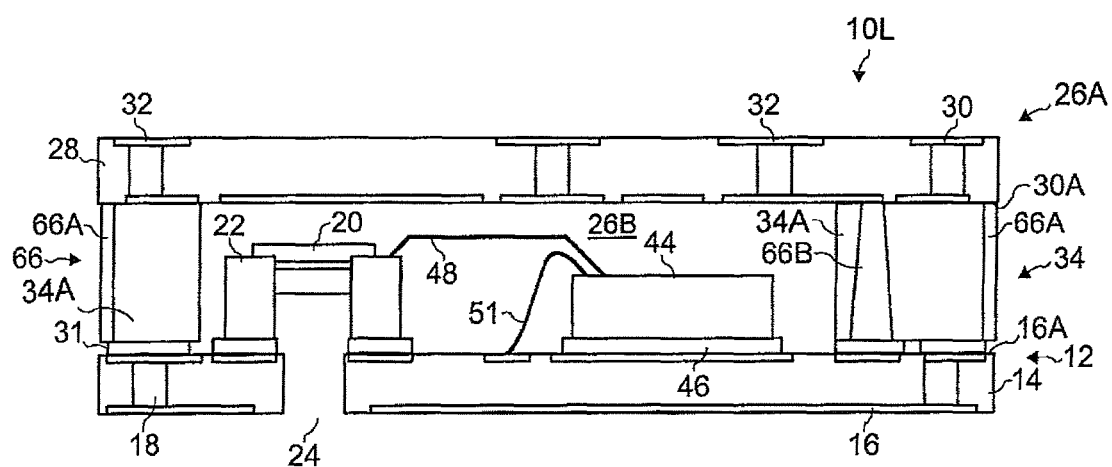
FIG. 12 is a cross-sectional side view of another embodiment of a MEMS package having a multiple die design.

Referring to FIG. 12, another embodiment of the device 10L is shown. The device 10L is similar to that shown in FIG. 8. The transducer 22 is placed on the base substrate 12 so to be positioned over the opening 24 formed through the base substrate 12. The amplifier 44 is positioned on the first surface of the base substrate 12 and next to the transducer 22. The transducer 22 and amplifier 44 are then electrically attached to metal traces 16 formed on the first surface of the base substrate 12 and to each other. Different methods may be used to attach and electrically couple the electronic devices to the substrate 14.

In the present embodiment, an adhesive 46 is used to attach the amplifier 44 to the base substrate 12. The adhesive may be a film, a paste or the like. The listing of the above is given as an example and should not be seen as to limit the scope of the present invention. Wirebonds 48 are then used to electrically connect the amplifier 44 to the transducer 22. The transducer 22 is attached to the base substrate 14 via a wire bonding process. However, the above is given only as an example. Other technology may be used to electrically couple the electronic devices without departing from the spirit and scope of the invention.

The amplifier 44 is electrically attached to the metal traces 16 formed on the base substrate 14. One or more wirebonds 55 are used to electrically attach the amplifier 44 to the base substrate 14. Each wirebond 55 will have a first end attached to the amplifier 44. A second end of each wirebond 55 is attached to a metal trace 16 formed on the first surface of the base substrate 12. In general, the wirebonds 55 are attached to the amplifier 44 and to the metal trace 16 via bond pads.

In this embodiment, the cover substrate 26A has a cavity 26B formed therein. The cavity 26B forms side wall sections 34A. The cover substrate 26A is positioned over and attached to the base substrate 12 so that the transducer 22 and amplifier 44 are positioned in the interior of the cavity 26B. The side wall sections 34A are attached to the first surface of the base substrate 12. In general, an adhesive is used to attach the side wall sections 34A to the base substrate 12. In accordance with one embodiment, the side wall sections 34A are attached to metal traces 16A on the first surface of the base substrate 12. A conductive material 31 is used to attach the side wall sections 34A to the metal traces 16.

One or more vias 66 are formed in the side wall section 34A of the cover substrate 26A. The vias 66 are plated or filled with a conductive material 68. The vias 66A around the perimeter of the device 10L are exposed. The vias 66A are exposed through a saw process during singulation of the device 10L. The vias 66A are generally used as grounding vias. The vias 66A are attached to ground planes 16A and 30A on the base substrate 12 and cover substrate 26A. The vias 66A are attached to ground planes 16A on the base substrate 12 by the conductive material 31 and to the ground planes 30A via the conductive material 68. The vias 66A plated/filled with the conductive material 68 forms a ground pathway between the base substrate 12 and the cover substrate 26A creating a Faraday cage around the transducer 22 to blocks out external static electric fields. The ground plane 30A forms a ground ring around the perimeter of the cover substrate 26A.

The device 10L further has vias 66B. The vias 66B are generally used as signal vias. In the embodiment shown in FIG. 12, the vias 66B are formed inside of the vias 66A and are not exposed. The vias 66B are attached to metal traces 16 on the base substrate 12 by the conductive material 31 and to the metal traces 30 via the conductive material 68. In this embodiment, the vias 66B plated/filled with the conductive material 68 form I/O signal pathways between the base substrate 12 and the cover substrate 26A.

Figure 13:
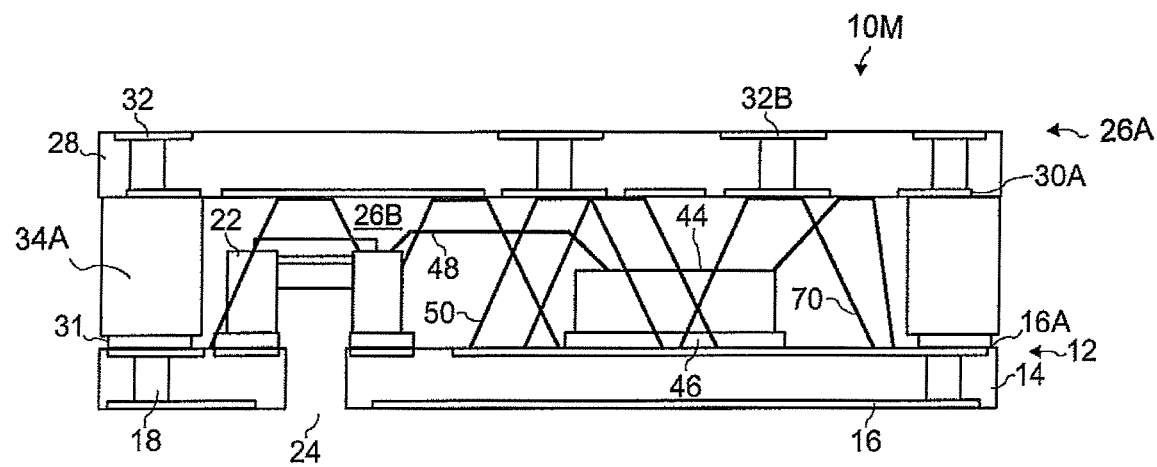
FIG. 13 is a cross-sectional side view of another embodiment of a MEMS package having a multiple die design.

Referring to FIG. 13, another embodiment of the device 10M is shown. The device 10I is similar to that shown in FIG. 9. The transducer 22 is placed on the base substrate 12 so to be positioned over the opening 24 formed through the base substrate 12. The amplifier 44 is positioned on the first surface of the base substrate 12 and next to the transducer 22. The transducer 22 and amplifier 44 are then electrically attached to metal traces 16 formed on the first surface of the base substrate 12 and to each other. Different methods may be used to attach and electrically couple the electronic devices to the substrate 14.

In the present embodiment, an adhesive 46 is used to attach the amplifier 44 to the base substrate 12. The adhesive may be a film, a paste or the like. The listing of the above is given as an example and should not be seen as to limit the scope of the present invention. Wirebonds 48 are then used to electrically connect the amplifier 44 to the transducer 22. The transducer 22 is attached to the base substrate 14 via a wire bonding process. However, the above is given only as an example. Other technology may be used to electrically couple the electronic devices without departing from the spirit and scope of the invention.

In this embodiment, the cover substrate 26A has a cavity 26B formed therein. The cavity 26B forms side wall sections 34A. The cover substrate 26A is positioned over and attached to the base substrate 12 so that the transducer 22 and amplifier 44 are positioned in the interior of the cavity 26B. The side wall sections 34A are attached to the first surface of the base substrate 12. In general, an adhesive is used to attach the side wall sections 34A to the base substrate 12. In accordance with one embodiment, the side wall sections 34A are attached to metal traces 16A on the first surface of the base substrate 12. A conductive material 31 is used to attach the side wall sections 34A to the metal traces 16.

The amplifier 44 is electrically attached to the metal traces 16 and 30 formed on the base substrate 14 and cover substrate 26A. One or more wirebonds 50 are used to electrically attach the amplifier 44 to the base substrate 14 and cover substrate 26A. Each wirebond 50 will have a first end attached to the amplifier 44. A second end of each wirebond 50 is attached to a metal trace 16 formed on the first surface of the base substrate 12. In general, the wirebonds 50 are attached to the amplifier 44 and to the metal trace 16 via bond pads. The wirebonds 50 form a loop having a height which is greater than the height of the side wall sections 34A.

A plurality of wirebonds 70 is used to form an RF shield around the transducer 22 and amplifier 44. Each wirebond 70 will have a first end attached to a ground plane 16A on the first surface of the base substrate. A second end of each wirebond 70 is attached to a ground plane 16A on the first surface of the base substrate 12. The wirebonds 70 form a loop having a height which is greater than the height of the side wall sections 34A.

When the cover substrate 26A is positioned over and attached to the base substrate 12 so that the transducer 22 and amplifier 44 are positioned in the interior of the cavity 26B, the top of the loops formed by the wirebonds 50 and 70 are compressed so that the top of the loops formed by the wirebonds 50 and 70 contact metal traces 30 and ground planes 30A respectively on the cover substrate 26A. Thus, the wirebonds 50 and 70 form I/O signal pathways and ground pathways respectively between the base substrate 12 and the cover substrate 26A. The wirebonds 70 create a Faraday cage around the transducer 22 and amplifier 44 to block out external static electric fields.

The cover substrate 26 may have a plurality of vias 32. The vias 32 are generally plated or filled with a conductive material. The vias 32A around the perimeter of the cover substrate 26 are grounded forming a ground ring around the perimeter of the cover substrate 26. The vias 32B formed within the perimeter formed by the vias 32A are used as interconnects for attaching the first surface of the cover substrate 26 to the end user's board.

In the embodiment shown in FIG. 13, the device 10M is positioned as a bottom port device. The metal traces 16 formed on the second surface of the base substrate 12 will generally have bond pads 42 formed thereon. The bond pads 42 will allow the second surface of the base substrate 12 to be attached to an end user's board.

The device 10M may also be used as a top port device. In this case, the device 10M is turned over so that the opening 24 is facing upward. The vias 32B are used as interconnects for attaching the first surface of the cover substrate 26A to the end user's board. In accordance with one embodiment, the vias 32B connected to pads (not shown) formed on the first surface of the cover substrate 26A and the pads are used as Land Grid Array (LGA) solder interconnects wherein a solder paste is applied directly between the pads and the end user's board.

Figure 14:
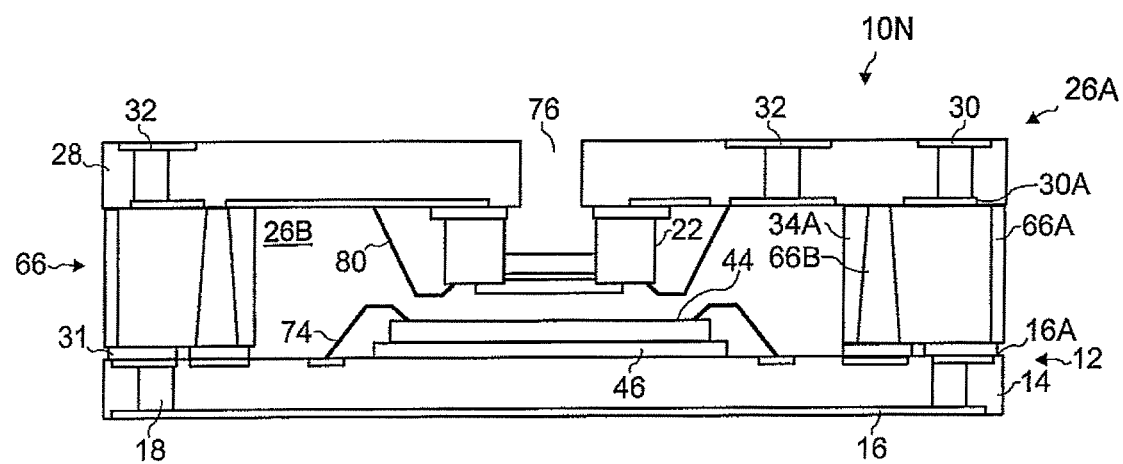
FIG. 14 is a cross-sectional side view of another embodiment of a MEMS package having a multiple die design.

Referring to FIG. 14, another embodiment of the device 1 ON is shown. The device 10N will have a base substrate 12 having an approximately planar first surface and an approximately planar second surface opposing the first surface. The base substrate 12 includes an insulation layer 14 having predetermined area and thickness. The insulation layer 14 has an approximately planar first surface and an approximately planar second surface opposing the first surface. The insulation layer 14 will have one or more metal traces 16 formed thereon. In the embodiment shown in FIG. 14, the insulation layer 14 has metal traces 16 formed on the first and second surface of the insulation layer 14. However, the number of metal traces 16 is not limited to the number shown in FIG. 14. In general, the insulation layer 14 will have multiple layers of metal traces 16 formed therein. When multiple layers of metal traces 16 are formed in the insulation layer 14, a dielectric layer is generally applied between the layers of metal traces 16. The dielectric layer is used as an insulating layer to separate the layers of metal traces 16. A soldermask may be placed over the top surface of the metal traces 16 to protect the metal traces 16. One or more vias 18 may be formed through the base substrate 12. The vias 18 are generally plated or filled with a conductive material. In the embodiment shown in FIG. 14, the base substrate 12 does not have the opening 24.

The amplifier 44 is positioned on the first surface of the base substrate 12. In the present embodiment, an adhesive 46 is used to attach the amplifier 44 to the base substrate 12. The adhesive may be a film, a paste or the like. The listing of the above is given as an example and should not be seen as to limit the scope of the present invention. Wirebonds 74 are then used to electrically connect the amplifier 44 to metal traces 16 formed on the first surface of the base substrate 12. Different methods may be used to electrically attach the amplifier 44 to the metal traces 16 without departing from the spirit and scope of the present invention.

The semiconductor device 10N has a cover substrate 26A. The cover substrate 26A has a cavity 26B formed therein. The cavity 26B forms side wall sections 34A. The cover substrate 26A has an insulation layer 28 having predetermined area and thickness. The insulation layer 28 will have one or more metal traces 30 formed thereon. The number of metal traces 30 is not limited to the number shown in FIG. 14. In general, the insulation layer 28 will have multiple layers of metal traces 30 formed therein. When multiple layers of metal traces 30 are formed in the insulation layer 28, a dielectric layer is generally applied between the layers of metal traces 30. The dielectric layer is used as an insulating layer to separate the layers of metal traces 30. A soldermask may be placed over the top surface of the metal traces 30 to protect the metal traces 30. One or more vias 32 may be formed through the side wall sections 26A of the cover substrate 26. The vias 32 are generally plated or filled with a conductive material. An opening 76 is formed through the cover substrate 26A.

The transducer 22 is placed on a first surface of the cover substrate 26A in the interior of the cavity 26B. The transducer 22 is placed on the first surface of the cover substrate 26A face down and positioned over the opening 76 formed through the cover substrate 26A. The opening 76 is an acoustic port that allows the transducer 22 to accurately receive sound waves and convert the sound waves to electrical signals and which provides a pressure reference for the transducer 22.

The transducer 22 is electrically coupled to the first surface of the cover substrate 26A. The transducer 22 is attached to the substrate 14 via a wire bonding process. However, the above is given only as an example. The transducer 22 may be attached through other technologies such as surface mount technology, through hole technology, flip chip technology, and the like.

Wirebonds 80 are then used to electrically attach the transducer to metal traces 30 on the first surface of the cover substrate 26A. Each wirebond 80 will have a first end attached to the transducer 22. A second end of each wirebond 80 is attached to a metal trace 30 on the first surface of the cover substrate 26A.

Side wall sections 34A are attached to the first surface of the base substrate 12. In general, an adhesive is used to attach the side wall sections 34A to the base substrate 12. In accordance with one embodiment, the side wall sections 34A are attached to metal traces 16A on the first surface of the base substrate 12. A conductive material 31 is used to attach the side wall sections 34A to the metal traces 16.

One or more vias 66 are formed in the frame member 66. The vias 66 are plated or filled with a conductive material 68. The vias 66A around the perimeter of the device 10N are exposed. The vias 66A are exposed through a saw process during singulation of the device 10N. The vias 66A are generally used as grounding vias. The vias 66A are attached to ground planes 16A on the base substrate 12 by the conductive material 31 and to the ground planes 30A on the cover substrate 26A by the conductive material 68 in the vias 66A. In this embodiment, the vias 66A plated/filled with the conductive material 68 forms a ground pathway between the base substrate 12 and the cover substrate 26 creating a Faraday cage around the transducer 22 to blocks out external static electric fields. The ground plane 30A forms a ground ring around the perimeter of the cover substrate 26.

The device 10N further has vias 66B. The vias 66B are generally used as signal vias. In the embodiment shown in FIG. 14, the vias 66B are formed inside of the vias 66A and are not exposed. The vias 66B are attached to metal traces 16 and 30 on the base substrate 12 and cover substrate 26 respectively. The vias 66B are attached to metal traces 16 on the base substrate 12 by the conductive material 31 and to the metal traces 30 on the cover substrate 26A by the conductive material 68 in the vias 66A. In this embodiment, the vias 66B plated/filled with the conductive material 68 form I/O signal pathways between the base substrate 12 and the cover substrate 26.

In the embodiment shown in FIG. 14, the device 10N is positioned as a top port device. The metal traces 16 formed on the second surface of the base substrate 12 will generally have bond pads 42 formed thereon. The bond pads 42 will allow the second surface of the base substrate 12 to be attached to an end user's board.

The device 10N may also be used as a bottom port device. In this case, the device 10N is turned over so that the opening 76 is facing downward. The vias 32 are used as interconnects for attaching the first surface of the cover substrate 26 to the end user's board. In accordance with one embodiment, the vias 32 are connected to pads (not shown) formed on the first surface of the cover substrate 26 and the pads are used as Land Grid Array (LGA) solder interconnects wherein a solder paste is applied directly between the pads and the end user's board.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor device comprising:
a base substrate having a plurality of metal traces and a plurality of base vias; an opening formed through the base substrate; at least one die attached to the first surface of the substrate and positioned over the opening, the opening allowing the at least one die to receive sound waves;
a cover substrate having a plurality of metal traces, a cavity in the cover substrate forming side wall sections around the cavity, the cover substrate attached to the base substrate wherein the at least one die is positioned in the interior of the cavity; and ground vias formed in the side wall sections to couple the ground planes in the base substrate to ground planes in the cover substrate to form an RF shield around the at least one die;

wherein side sections of the ground vias are exposed.

2. A semiconductor device in accordance with claim 1, further comprising signal vias formed in the side wall sections and coupled to metal traces in the base substrate and cover substrate.

3. A semiconductor device in accordance with claim 2, wherein the conductive signal vias are formed along an inner perimeter of the side wall members and the conductive ground vias are formed along an outer perimeter of the side wall members.

4. A semiconductor device in accordance with claim 1, further comprising a plurality of wires, wherein each wire has a first end attached to the ground plane on the base substrate and a second end attached to the ground plane on the base substrate, each of the wires forming a loop wherein a top section of each loop contacts the ground plane of the cover substrate.

5. A semiconductor device in accordance with claim 1, further comprising a plurality of cover vias formed in the cover substrate, wherein at least one of the cover vias connected to a plurality of pads when the cover substrate is attached to an I/O board.

6. A semiconductor device comprising:
a base substrate having a plurality of metal traces and a plurality of base vias;
an opening formed through the base substrate;
a first electronic component attached to the first surface of the base substrate and positioned over the opening, the opening allowing the first electronic device to receive sound waves;
a second electronic component attached to the first surface of the base substrate next to the first electronic component;
a first set of wirebonds to couple the first electronic component to the second electronic component;
a cover substrate having a plurality of metal traces, a plurality of cover vias, a cavity in the cover substrate forming side wall sections around the cavity, the cover substrate attached to the base substrate wherein the first and second electronic components are positioned in the interior of the cavity; and
a plurality of grounding vias formed in the sidewall for coupling ground planes in the base substrate to ground planes in the cover substrate to form an RF shield around the first and second electronic components;
wherein side sections of the ground vias are exposed.

7. A semiconductor device in accordance with claim 6 further comprising means coupled to the metal traces on the base substrate and the metal traces on the cover substrate to form I/O pathways between the base substrate and cover substrate.

8. A semiconductor device in accordance with claim 6, further comprising a second set of wirebonds, wherein each of the second set of wirebonds has a first end attached to the ground plane on the base substrate and a second end attached to the ground plane on the base substrate forming a loop wherein a top section of each loop contacts the ground plane of the cover substrate.

9. A semiconductor device in accordance with claim 7, wherein the means coupled to the metal traces on the base substrate and the metal traces on the cover substrate to form I/O pathways between the base substrate and cover substrate are signal vias formed in the side wall sections.

10. A semiconductor device in accordance with claim 7, wherein the means coupled to the metal traces on the base substrate and the metal traces on the cover substrate to form I/O pathways comprises a third set of wirebonds, wherein each of the third set of wirebonds have a first end attached to the second electronic component and a second end attached to the metal trace of the base substrate, each of the third set of wirebonds forming a loop wherein a top section of each loop contacts the metal traces of the cover substrate.

11. A semiconductor device in accordance with claim 7, wherein the ground vias formed in the side wall sections and the means coupled to the metal traces on the base substrate and the metal traces on the cover substrate to form I/O pathways between the base substrate and cover substrate are signal vias formed in the side wall sections, wherein the signal vias are formed along an inner perimeter of the side wall members and the ground vias are formed along an outer perimeter of the side wall members.

12. A semiconductor device comprising:
a base substrate having a plurality of metal traces, a plurality of base vias, and a plurality of base pads;
a cover substrate having a plurality of metal traces, a plurality of cover vias, and a plurality of cover pads;
a cover substrate having a plurality of metal traces, a plurality of cover vias, and a plurality of cover pads, a cavity in the cover substrate forming side wall sections around the cavity;
an opening formed through the cover substrate into the cavity;
a first die attached to the first surface of the cover substrate in the cavity and positioned over the opening and electrically attach to the metal traces of the cover substrate, the opening allowing the first die to receive sound waves;
a second die attached to the first surface of the base substrate and electrically attach to the metal traces of the base substrate;
pathways formed in the side wall sections to couple ground planes in the base substrate with ground planes in the cover substrate to form an RF shield around the first die and the second die, wherein the pathways are conductive vias; and
means coupled to the metal traces on the base substrate and the metal traces on the cover substrate to form I/O pathways between the base substrate and cover substrate;
wherein the conductive vias have exposed sides.

13. A semiconductor device in accordance with claim 12, wherein the means coupled to the metal traces on the base substrate and the metal traces on the cover substrate to form I/O pathways between the base substrate and cover substrate are signal vias formed in the side wall sections.

14. A semiconductor device in accordance with claim 12, wherein the means coupled to the metal traces on the base substrate and the metal traces on the cover substrate to form I/O pathways between the base substrate and cover substrate are signal vias formed in the side wall sections, wherein the signal vias are formed along an inner perimeter of the side wall members and the ground vias are formed along an outer perimeter of the side wall members.

* * * * *